RING COUNTER WITH PARALLEL INPUT EMPLOYING DIODE-CAPACITOR COMBINATION GATING STAGES TRIGGERED AT TRAILING EDGES OF PULSES
Filed Jan. 17, 1962
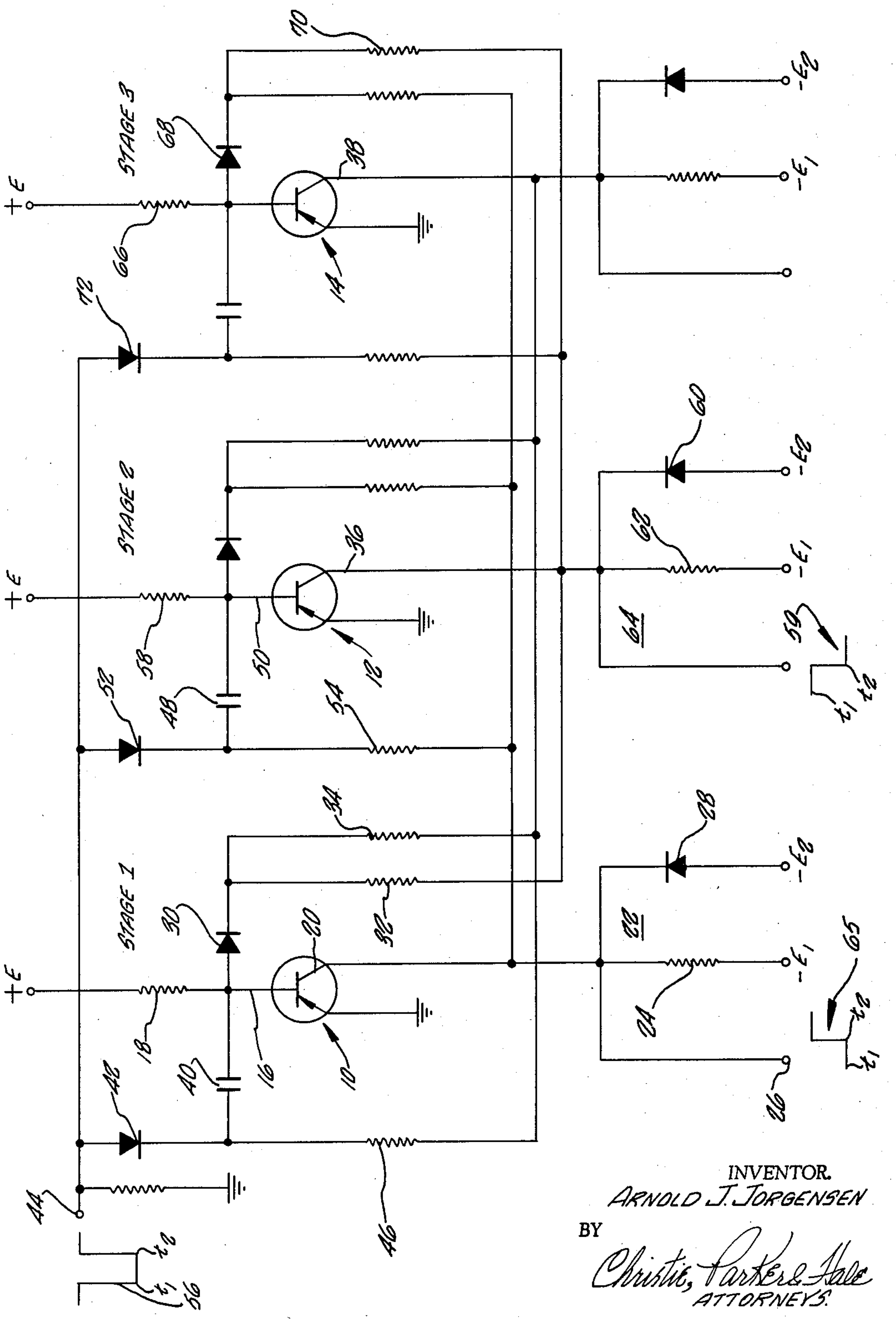
INVENTOR.
ARNOLD J. JORGENSEN
BY
Christie, Parker & Hale
ATTORNEYS.

United States Patent Office 3,122,656
Patented Feb. 25, 1964

3,122,656

RING COUNTER WITH PARALLEL INPUT EMPLOYING DIODE-CAPACITOR COMBINATION GATING STAGES TRIGGERED AT TRAILING EDGES OF PULSES

Arnold J. Jorgensen, Duarte, Calif., assignor to Burroughs Corporation, Detroit, Mich., a corporation of Michigan Filed Jan. 17, 1962, Ser. No. 166,771
4 Claims. (Cl. 307—88.5)

This invention is directed to improvements in electronic counting devices, and more particularly to an improved ring counter design for triggering on the trailing edges of input pulses applied thereto.

Electronic circuits for counting input pulses are well known. Such counting devices in general include a plurality of stages, each stage having a pair of active elements defining a bistable circuit which is triggered on the leading edge of an input pulse applied thereto. The use of two active elements in each stage materially increases the cost of the counter while triggering on the leading edge of an input pulse signal presents the practical problem of possible retriggering of the bistable circuits during the time duration of the input pulse.

In contrast to the conventional counter circuits the present invention provides a high speed, simple, inexpensive counter design which is triggered at the trailing edge of input pulses applied thereto.

Briefly, to accomplish the above, the counter of the present invention, in a basic form, includes a plurality of transistors, one transistor is associated with each stage of the counter. Each transistor is arranged in a grounded emitter configuration with an output circuit coupled to its collector terminal. The base of each transistor is resistively coupled to the collector of each other transistor. Coupled between the base of each transistor and the collector of the transistor in a preceding stage of the counter is a capacitor. Coupled between an input terminal and each capacitor is a diode. Biasing means coupled to the transistors biases the transistors such that one transistor is nonconductive while each of the remaining transistors is conductive and such that the diode associated with the stage of the counter following the nonconductive transistor is forwardly biased.

In response to the leading edge of an input pulse applied to the input terminal the diode associated with the stage of the counter following the nonconductive transistor is reverse biased. The capacitor associated therewith is charged through the output circuit coupled to the nonconductive transistor. At the trailing edge of the input pulse the diode is again forward biased. A reverse current then flows from the charged capacitor into the base of the associated transistor causing the transistor to switch to a nonconductive state. As the transistor switches to a nonconductive state a current path is provided from the base of the originally nonconductive transistor to the output circuit of the now nonconductive transistor. The originally nonconductive transistor thus switches to a conductive state. This process is repeated for each input pulse.

Since only one stage of the counter is triggered in response to any given input pulse the present invention provides a high speed counter having a high reliability of operation. Further, since each stage of the counter includes a single transistor, the counter design of the present invention is extremely simple and relatively inexpensive.

The above, as well as other features of the present invention, may be more clearly understood by reference to the following detailed description when considered with the drawing, the single figure of which is a schematic representation of a preferred form of the counter of the present invention.

By way of example only, the counter illustrated in the drawing is a three-stage ring counter. The ring counter includes a plurality of PNP type transistors 10, 12, and 14, one associated with each stage of the counter. Thus, for example, the transistor 10 is associated with stage one, the transistor 12 with stage two, and the transistor 14 with stage three. Each stage of the counter is substantially the same. Only the first stage of the counter will be described in detail, together with the similar elements of stages two and three necessary to an understanding of the operation of the ring counter.

The transistor 10 is arranged in a grounded emitter configuration. Thus the transistor 10 possesses both a current and a voltage gain. The transistor 10 includes a base terminal 16 which is coupled through a biasing resistor 18 to a source of positive potential represented as $+E$. The transistor 10 also includes a collector terminal 20 which is coupled to an output circuit represented generally as 22.

The output circuit 22, by way of example, includes a load resistor 24 which is coupled between the collector terminal 20 and a source of negative potential $-E_1$. An output terminal 26 is coupled to a junction of the resistor 24 and the collector 20. A diode 28 is coupled between a junction of the resistor 24 and the collector 20 and a source of negative potential $-E_2$. As illustrated, the cathode of the diode 28 is coupled to the resistor 24. The source of negative potential $-E_1$ has a magnitude which is greater than the source of negative potential $-E_2$. In this manner the diode 28 functions to limit the maximum voltage appearing at the output terminal 26 when the transistor 10 is in a nonconductive state.

Coupled to the base terminal 16 of the transistor 10 is a diode 30. The anode of diode 30 is coupled to the base terminal 16 while the cathode is coupled to a pair of resistors 32 and 34. The resistor 32 is coupled to the collector 36 of the transistor 12 while the resistor 34 is coupled to the collector 38 of the transistor 14.

Thus, as illustrated, the base terminal of each transistor is coupled to the collector terminal of each of the remaining transistors.

Also coupled to the base terminal 16 of the transistor 10 is a capacitor 40. The capacitor 40 is in turn coupled through a diode 42 to an input terminal 44 and through a resistor 46 to the collector terminal 38 of the transistor 14. The diode 42 has its anode coupled to the input terminal 44 and its cathode coupled to the capacitor 40.

By proper proportioning of the values of the potential sources $+E$ and $-E_1$, as well as the value of the resistors 18, 32, 34, and 46, and the similar resistors associated with each stage of the counter, the transistors 10, 12 and 14 are biased such that one transistor is in a nonconductive state while the remaining transistors are in a conductive state. For analysis it is assumed that the transistor 10 is biased to a nonconductive state while the transistors 12 and 14 are biased to a conductive state.

With the transistors 12 and 14 biased to a conductive state the potential appearing at the collector terminals 36 and 38 is substantially at ground potential. Due to the connection of the diode 42 through the resistor 46 to the collector 38 the diode 42 is normally reverse biased. Due to a coupling of the resistors 32 and 34 to the collectors 36 and 38, respectively, the base terminal 16 of the transistor 10 is at a slightly positive potential relative to its emitter terminal. Thus, the transistor 10 is maintained in a nonconductive state.

Since the base terminals of the transistors 12 and 14 are coupled to the collector terminal 20 of the transistor 10 and hence to the source of negative potential $-E_1$, a substantial base current flows in the transistors 12 and 14 maintaining these transistors in a conductive state.

Similar to stage one of the counter, stage two of the counter includes a capacitor 48 coupled to a base terminal 50 of the transistor 12. The capacitor 48 is also coupled through a diode 52 to the input terminal 44 and through a resistor 54 to the collector 20 of the transistor 10. Due to its coupling to the collector terminal 20 and hence to the source of negative potential $-E_1$, the diode 52 is forward biased when the transistor 10 is in a nonconductive state.

In counting, an input signal having a waveform similar to that represented at 56 is applied to the input terminal 44. At the leading edge of the input pulse, $t_1$, the diodes 42 and 72 associated with stages one and three of the counter are in a reverse biased state. Stage three of the counter thus remains in a conductive state. Due to the coupling of the base 16 of the transistor 10 through the capacitor 40 and the resistor 46 to the collector 38 of the transistor 14, the transistor 10 remains in a nonconductive state.

At the leading edge of the input pulse, however, the diode 52 associated with stage two of the counter is reverse biased. A charging path is then provided for the capacitor 48 from the source of positive potential $+E$ through a resistor 58, the resistor 54, the resistor 24 to the source of negative potential $-E_1$. The capacitor 48 charges rapidly.

At the trailing edge of the input pulse, $t_2$, the diode 52 is again forward biased. Since the voltage cannot change instantaneously across the capacitor 48, a large positive voltage is developed at the base terminal 50 of the transistor 12 causing the transistor 12 to switch to a nonconductive state.

When the transistor 12 switches to a nonconductive state the potential at the collector terminal 36 goes negative as represented by the waveform 59 to a value determined by the diode 60 and the value of the source of negative potential $-E_2$. At this time a current path is provided from the source of positive potential $+E$ through the resistor 18, the diode 30, the resistor 32, the resistor 62 to the source of negative potential $-E_1$ associated with an output circuit 64 of the second stage of the ring counter. The transistor 10 then switches to a conductive state and the potential at the collector 20 rises to ground as indicated by the waveform 65.

When the transistor 12 switches to a nonconductive state and the transistor 10 switches to a conductive state, the transistor 14 is held in a conductive state by a current path from the source of positive potential through a resistor 66 coupled to the base of the transistor 14, a diode 68, a resistor 70 through the resistor 62 to the source of negative potential $-E_1$. Thus, in response to the input pulse applied to the input terminal 44 stage two of the counter is triggered to a nonconductive state and stage one to a conductive state while stage three is maintained in its originally conductive state.

With stage two in a nonconductive state the diode 72 associated with stage three is now forward biased and ready to be reverse biased in response to an input pulse applied to the input terminal 44. Thus, in response to each input pulse a different stage of the counter is triggered to a nonconductive state while the remaining stages of the counter are maintained in a conductive state, thereby allowing for high speed counting with a high degree of reliability.

What is claimed is:

1. A counter comprising:

an input means for receiving an input signal, a plurality of transistors, each transistor including a base, an emitter, and a collector, and each connected in a grounded emitter configuration to define a plurality of transistor stages for the counter;

a plurality of output means, one coupled to the collector of each transistor;

a plurality of electronic switches coupled to the input means, one switch being associated with each stage of the counter;

a plurality of capacitors, one associated with each stage of the counter and each having a first terminal coupled to the base of a different transistor and a second terminal coupled to a different electronic switch;

biasing means including means coupled between the base of each transistor and the collector of each other transistor for biasing the transistors such that one stage is in a nonconductive state while the other stages are in a conductive state;

means including a connection of a junction of the electronic switch and the capacitor associated with each stage to the collector of the transistor in the preceding stage of the counter for closing only the electronic switch associated with the stage following the nonconductive stage and for opening said electronic switch during the time duration of the input signal applied to the input means; and means for charging the capacitor coupled to the base of the transistor associated with the stage following the nonconductive stage while said electronic switch is open to switch said transistor to a nonconductive state at the termination of the input signal applied to the input means such that the stage following the nonconductive state switches to a nonconductive state and the nonconductive state switches to a conductive state at the termination of the input signal.

2. A counter comprising:

an input means for receiving an input signal;

a plurality of transistors each having a base, an emitter, and a collector, and each connected in a grounded emitter configuration to define a plurality of transistor stages for the counter;

a plurality of output means, one coupled to the collector of each transistor;

a plurality of diodes coupled to the input means, one diode being associated with each stage of the counter;

a plurality of capacitors, one associated with each stage of the counter and each coupled between the base of a different transistor and a different diode;

biasing means including a first plurality of resistors, one coupled between the base of each transistor and the collector of each other transistor for biasing the transistors such that one stage is in a nonconductive state while the other stages are in a conductive state;

means including a second plurality of resistors one coupled between a junction of the diode and the capacitor associated with each stage and the collector of the transistor in the preceding stage of the counter for forward biasing only the diode associated with the stage following the nonconductive state and for reverse biasing said diode during the time duration of the input signal applied to the input means; and means for charging the capacitor coupled to the base of the transistor associated with the stage following the nonconductive stage while said diode is reverse biased to switch said transistor to a nonconductive state at the termination of the input signal applied to the input means such that the stage following the nonconductive state switches to a nonconductive state and the nonconductive state switches to a conductive state at the termination of the input signal.

3. The apparatus defined in claim 2 wherein the biasing means further includes a plurality of biasing resistors, one coupled between the base of each transistor and a first source of potential and wherein each output means includes a load resistor coupled between the collector of an associated transistor and a second source of potential.

4. The apparatus defined in claim 3 wherein each transistor is a PNP type transistor and the first source of potential is positive relative to the second source of potential.

References Cited in the file of this patent

UNITED STATES PATENTS 3,070,713 Leightner -------------- Dec. 25, 1962